(12) United States Patent
Mukherjee et al.

(10) Patent No.: US 9,934,976 B2
(45) Date of Patent: Apr. 3, 2018

(54) METHODS OF FORMING LOW INTERFACE RESISTANCE RARE EARTH METAL CONTACTS AND STRUCTURES FORMED THEREBY

(75) Inventors: Niloy Mukherjee, Beaverton, OR (US); Matt Metz, Portland, OR (US); Gilbert Dewey, Hillsboro, OR (US); Jack Kavalieros, Portland, OR (US); Robert S Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/317,180

(22) Filed: Dec. 18, 2008

(65) Prior Publication Data
US 2010/0155954 A1 Jun. 24, 2010

(51) Int. Cl.
*H01L 21/285* (2006.01)
*H01L 21/768* (2006.01)

(52) U.S. Cl.
CPC .. *H01L 21/28518* (2013.01); *H01L 21/76814* (2013.01)

(58) Field of Classification Search
CPC ................ H01L 21/28518; H01L 21/76814
USPC .................... 257/751, 368, 369; 438/586
See application file for complete search history.

(56) References Cited

U.S. PATENT DOCUMENTS

| 6,194,295 B1* | 2/2001 | Chang et al. ............. 438/586 |
| 2008/0308877 A1* | 12/2008 | Kinoshita et al. ......... 257/369 |
| 2009/0050972 A1* | 2/2009 | Lindsay et al. ........... 257/368 |
| 2009/0085211 A1* | 4/2009 | Robison et al. .......... 257/751 |
| 2009/0191705 A1* | 7/2009 | Liu .................. H01L 21/28518 438/653 |

\* cited by examiner

*Primary Examiner* — Errol Fernandes
(74) *Attorney, Agent, or Firm* — Patent Capital Group

(57) ABSTRACT

Methods and associated structures of forming a microelectronic device are described. Those methods may include forming a contact opening in an inter layer dielectric (ILD) disposed on a substrate, wherein a source/drain contact area is exposed, forming a rare earth metal layer on the source/drain contact area, forming a transition metal layer on the rare earth metal layer; and annealing the rare earth metal layer and the transition metal layer to form a metal silicide stack structure.

24 Claims, 6 Drawing Sheets

METHODS OF FORMING LOW INTERFACE RESISTANCE RARE EARTH METAL CONTACTS AND STRUCTURES FORMED THEREBY

BACKGROUND OF THE INVENTION

A microelectronic transistor gate process which forms a silicide through a contact hole may exhibit a high silicide interface resistance in some cases. As transistor pitch and size are scaled, contact dimensions may also scale, thus decreasing contact surface area and making contact resistance a performance limiter. A move towards lowering the contact resistance of silicides is beneficial in order to meet transistor performance roadmaps of future technologies.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
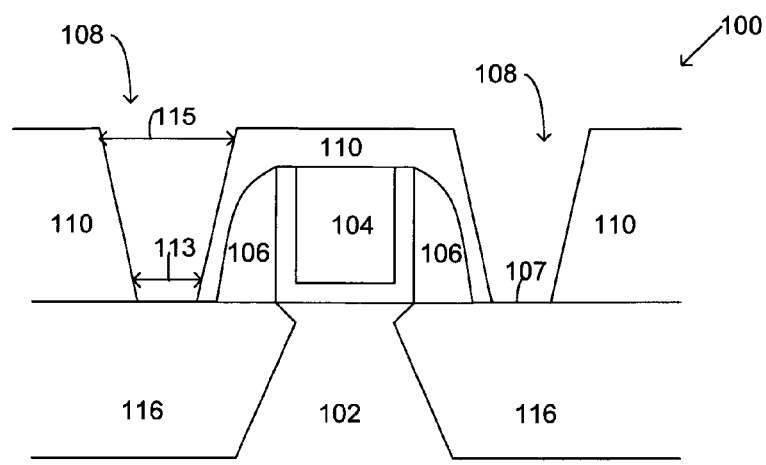
FIGS. 1a-1g represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods of forming microelectronic structures are described. Those methods may include forming a contact opening in an inter layer dielectric (ILD) disposed on a substrate, wherein a source/drain contact area is exposed, forming a rare earth metal layer on the source/drain contact area, forming a transition metal layer on the rare earth metal layer; and annealing the rare earth metal layer and the transition metal layer to form a metal silicide stack structure. Methods of the present invention enable very low interface resistance contact at highly scaled pitch source/drain structures.

Methods of the present invention are depicted in FIGS. 1a-1g. FIG. 1a shows a cross section of a portion of a transistor structure 100 comprising a substrate 102, and a gate 104, which may comprise a metal gate in some embodiments, and may comprise such metal gate materials as hafnium, zirconium, titanium, tantalum, or aluminum, or combinations thereof, for example. In other embodiments, the gate may comprises other materials such as polysilicon, for example. The substrate 102 may be comprised of materials such as, but not limited to, silicon, silicon-on-insulator, germanium, indium antimonide, lead telluride, indium arsenide, indium phosphide, gallium arsenide, gallium antimonide, indium gallium arsenide, indium aluminum arsenide, or combinations thereof. The substrate 102 may comprise a portion of an n-type metal oxide semiconductor (NMOS) transistor in some embodiments.

The transistor structure 100 may further comprise a spacer material 106, that may be adjacent to the gate 104. The spacer material 106 may comprise a dielectric material in some cases, such as but not limited to silicon dioxide and/or silicon nitride materials. The transistor structure 100 may further comprise a contact opening 108, which may comprise an opening in ILD 110, such as a silicon oxide ILD, for example. In an embodiment, the contact opening 108 may comprise a tapered contact opening 108, wherein the tapered contact opening 108 may comprise a top portion width 115 that is larger than a bottom portion width 113. In other embodiments, the contact opening 108 may comprise a substantially straight opening (non-tapered). A source/drain contact area 107 may be exposed during the formation of the contact opening 108, wherein the source/drain contact area 107 may comprise a surface portion of a source/drain region 116. The contact opening 108 may be adjacent to the gate 104, and may serve as an opening in which a contact metal may subsequently be formed.

Figure 1B:
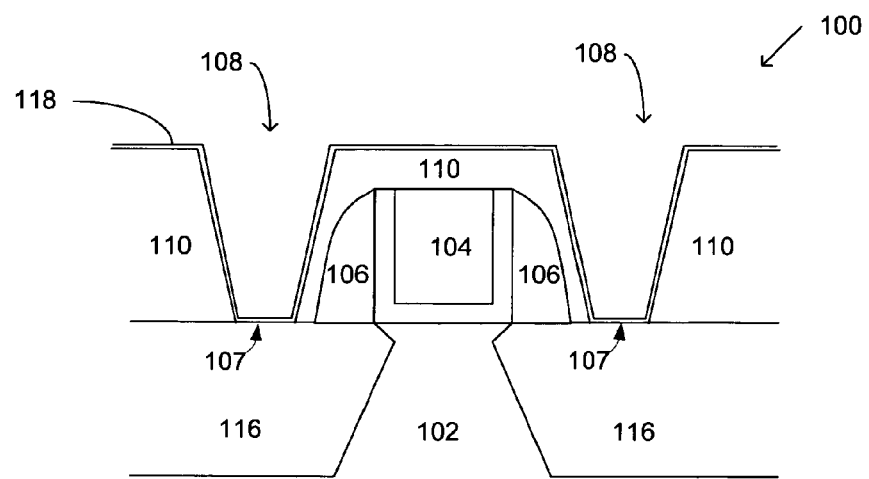

In an embodiment, a rare earth metal layer 118, such as but not limited to rare earth metals comprising Yttrium, Lanthanum, Cerium, Praseodymium, Neodymium, Promethium, Samarium, Europium, Gadolinium, Terbium, Dysprosium, Holmium, Erbium, Thulium, and Ytterbium, for example, may be formed on the source/drain contact area 107 (FIG. 1b).

In an embodiment, the rare earth metal layer 118 may comprise any such rare earth metal that may form a silicide with the silicon material of the source/drain region 116. In an embodiment, the rare earth metal layer 118 may comprise a thickness of about 300 angstroms or less. The rare earth metal layer 118 may be formed by at least one of chemical vapor deposition (CVD), atomic layer deposition (ALD), physical vapor deposition (PVD), electroplating and electroless plating techniques, but other thin film deposition techniques may be used according to the particular application. In an embodiment, the rare earth metal layer 118 may be formed in a vacuum deposition tool, and may be formed in a multi-chamber deposition tool in some cases.

The rare earth metal layer 118 may form a rare earth metal silicide that may provide a low resistance source/drain 116 contact for transistor structures, such as the transistor structure 100. In an embodiment, the rare earth metal layer 118 may enable low resistance contacts to n-doped silicon, such as in NMOS transistor structure contacts, due to the lower rare earth metal-semiconductor Schottky barrier heights realized, as compared to transition metal silicide contact materials that may be formed directly on the source/drain contact area, as in prior art contact structures.

Figure 1C:
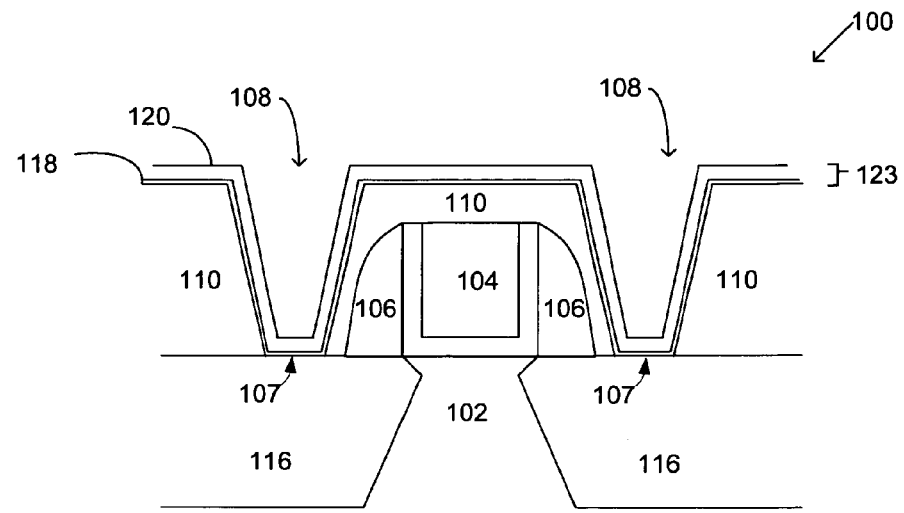

In an embodiment, a transition metal layer 120 may be formed on the rare earth metal layer 118 (FIG. 1c). In an embodiment, the transition metal layer 120 may comprise such transition metals as nickel, titanium and cobalt, for example, but may comprise any transition metal according to the particular application. The transition metal layer 120 may be formed by at least one of CVD, ALD, PVD, electroplating and electroless plating techniques. In an embodiment, the transition metal layer 120 may be formed in the same deposition tool that was used to form the rare earth metal layer 118, and may be formed without breaking vacuum.

In an embodiment, a thickness of the transition metal layer 120 may comprise about 100 angstroms or less. In an embodiment, the percentage of the rare earth metal layer 118 thickness may comprise less than about 50 percent of a total contact stack structure 123 thickness. For example, a transition metal layer 120 comprising nickel may comprise a thickness from about 5 angstroms to about 100 angstroms, with the balance of the total contact metal stack structure 123 comprising the rare earth metal layer 118 thickness. Thus, the contact metal stack structure 123 (pre-anneal) that may comprise the transition metal 120 disposed on the rare earth metal 118 may be formed on the source/drain contact area 107 of the source/drain region 116, and may be formed such that the contact metal stack structure 123 may contain little to no oxygen.

In another embodiment, the contact metal stack structure 123 may comprise layered structures, wherein alternating layers of the rare earth metal 118 and the transition metal layer 120 may be stacked upon each other. In another embodiment, the rare earth metal 118 and the transition metal 120 may be co-deposited (e.g., co-sputtering and/or interwoven by atomic layer deposition (ALD) pulses of each metal). In another embodiment, the rare earth metal 118 and the transition metal 120 may comprise combinations of co-deposited and layered structures. For example, the contact metal stack structure 123 may comprise co-deposited rare earth and transition metal layers as a first layer, followed by a pure transition metal layer on top to prevent oxidation).

Figure 1D:
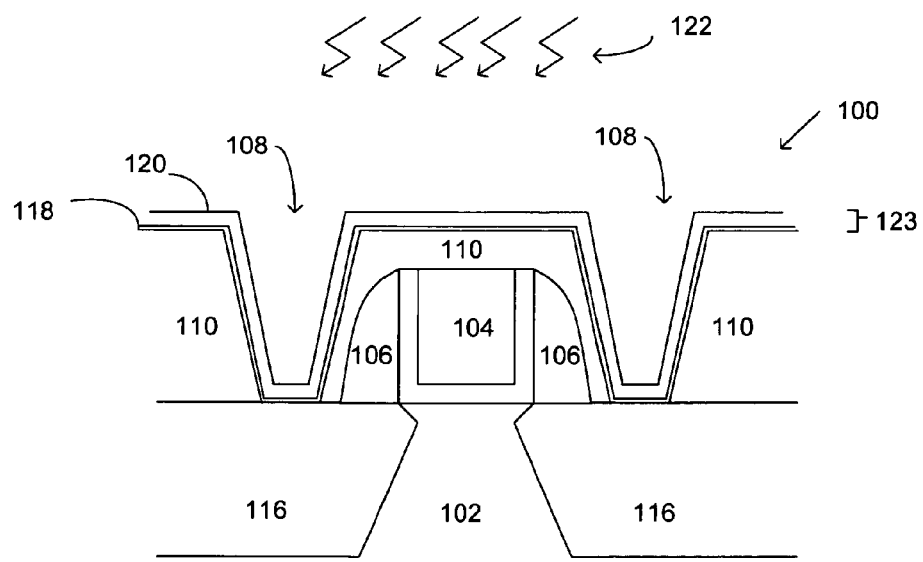
Figure 1E:
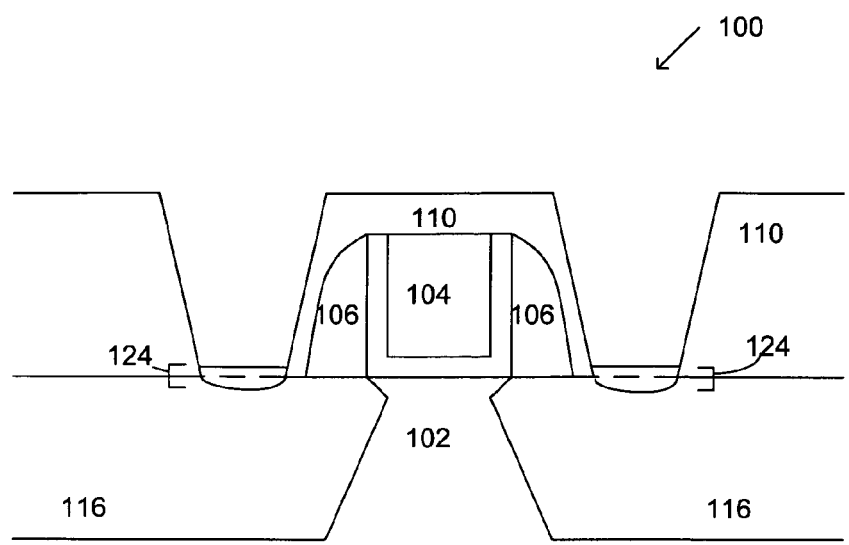

In an embodiment, an anneal 122 may be performed on the rare earth metal layer 118 and the transition metal layer 120 of the transistor structure 100 (FIG. 1*d*). In some cases, since very thin layers of the rare earth metal layer 118 relative to the transition metal layer thickness 120 may be utilized, the silicidation temperatures and times are not expected to be very different from that of the particular transition metal layer 120 utilized. In an embodiment, the anneal 122 temperature may comprise below about 700 degrees Celsius, but will depend upon the particular stacked metal silicide that may be formed.

Figure 1F:
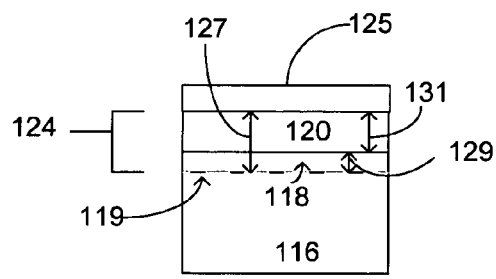

The anneal 122 may serve to form the stacked metal silicide 124 (FIG. 1*e*) that may form by a reaction between the rare earth metal layer 118 and a portion 114 of the source/drain region 116. The stacked metal silicide 124 may comprise the transition metal layer 120 disposed on the rare earth metal layer 118, which is disposed on/reacted with a portion of the source/drain region 116 (FIG. 1*f*, depicting a cross-sectional portion of the stacked metal silicide 124). In an embodiment, the stacked metal silicide 124 may comprise a thickness 127 of less than about 400 angstroms. In an embodiment, a thickness 129 of the rare earth metal layer 118 may comprise less than about 15 percent of the thickness 127 of the stacked metal silicide 124, but may vary depending upon the particular application. In an embodiment, a thickness 131 of the transition metal layer 120 may comprise about less than about 200 angstroms. In an embodiment, the rare earth metal may comprise less than about 25 percent of the thickness 127 of the stacked metal silicide 124. Annealing may also result in substantially complete mixing of rare earth layers and transition metal layers, forming a single layer, in some embodiments.

In prior art contact structures, a transition metal may be formed directly on the source/drain contact area to form a silicide. For example, nickel silicides may be advantageous when forming narrow dimension contacts since the interface between silicon and nickel tends to be very smooth, and the intrinsic phase resistivity of nickel silicide may also be quite low. However, nickel silicides (as well as other transition metal silicides) tend to comprise high Schottky barrier heights. For example, nickel silicides may comprise a Schottky barrier height of about 0.60 electron volts to about 0.65 electron volts on n-doped silicon.

Rare earth metal silicides, on the other hand, possess much lower Schottky barrier heights with n-doped silicon (on the order of about 0.25 electron volts to about 0.38 electron volts, in some cases. However, rare earth metal silicides have been difficult to process and control in some cases, wherein in some cases the high reactivity of rare earth metals tend to make them very susceptible to oxygen contamination, and some rare earth metals may require higher silicidation temperatures and times as compared with transition metal silicidation processes. Rare earth metal silicides may also tend to form rough interfaces with silicon, (such as the silicon of a source/drain region, for example) in some cases.

In an embodiment, because both the rare earth metal layer 118 and the transition metal layer 120 may be deposited one after the other without a vacuum break, the exposure of the rare earth metal layer 118 to atmospheric oxygen is greatly reduced or eliminated. Thus, contamination problems that may be encountered in rare earth metal processing are avoided, and the stacked metal silicide 124 may comprise little to no oxygen. The embodiments of the present invention enable the optimization of the individual strengths of rare earth metal contacts and transition metal contacts while diminishing their individual weaknesses. Deposition of a thin rare earth metal layer prior to a transition metal layer on a source/drain region reduces the Schottky barrier height of the stacked metal silicide contact structure 124.

The formation of the rare earth metal layer 118 on the source/drain contact area 107 before the transition metal formation will ensure that the rare earth metal layer is the primary contacting metal to the silicon before the silicidation anneal is performed. In an embodiment, the rare earth metal layer 118 may segregate to a silicide-silicon interface 119 after the silicidation anneal. This segregation may reduce the contact resistance by lowering the effective Schottky barrier height at the interface. This is due to the much lower Schottky barrier heights realized between rare earth metal silicides and silicon compared to traditional transition metal silicides.

Since in some cases the stacked silicide contact structure 124 comprises very thin layers of the rare earth metal layer 118 relative to the transition metal layer thickness 120, the silicidation kinetics may also tend to be dominated by transition metal atoms, and the resulting silicide phase resistivities and silicide-silicon interface roughness post-anneal may be close to that of a purely transition metal silicide.

Figure 1G:
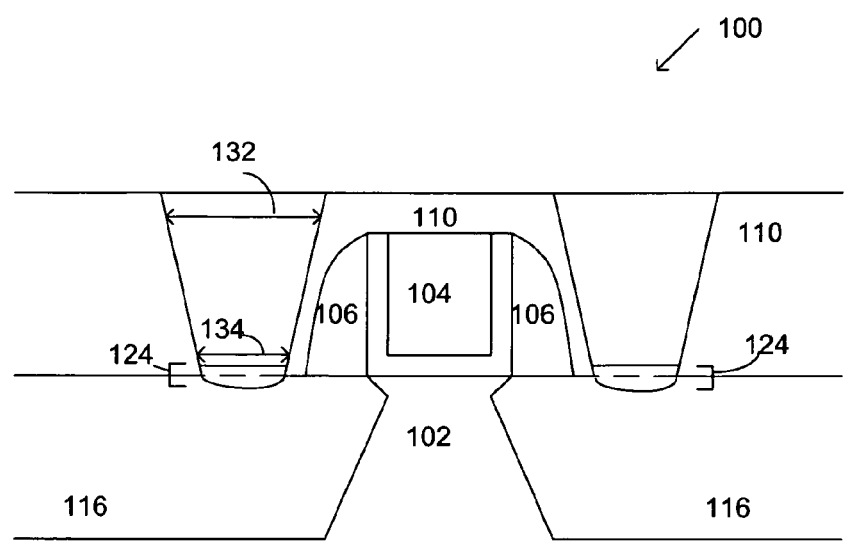

A contact metal 130 may be formed in the contact opening 108 on the stacked silicide contact 124 after it is annealed (FIG. 1*g*). The contact metal 130 may be formed by a process such as but not limited to chemical vapor deposition (CVD) process, for example. In an embodiment, the contact metal 130 may be tapered, wherein a top width 132 of the contact metal 130 may be larger than a bottom width 134 of the contact metal 130. In other embodiments, the contact metal 130 may comprise a substantially straight (non-tapered) contact metal 130. In an embodiment, the contact metal 130 may comprise at least one of tungsten, titanium, titanium nitride and titanium tungsten.

Figure 2A:
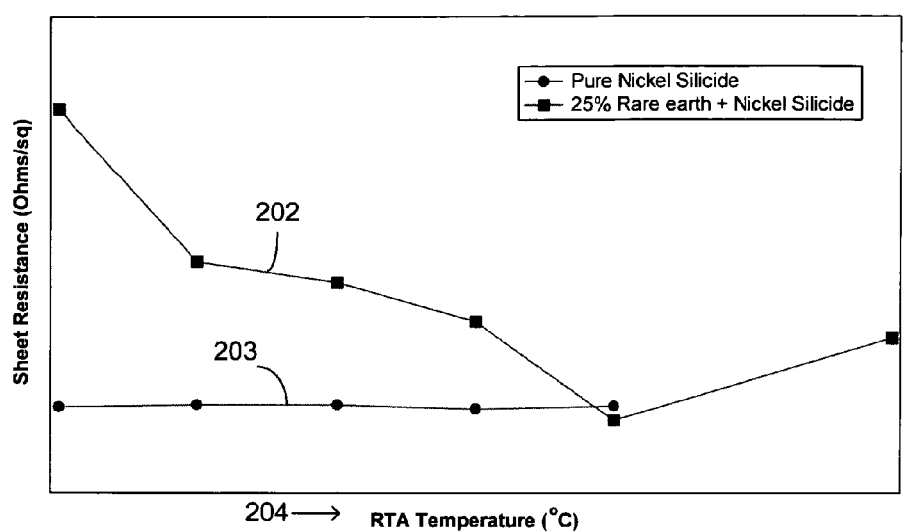
FIGS. 2a-2b represent graphs according to an embodiment of the present invention.

In an embodiment, a sheet-resistance of a stacked silicide structure may be measured after silicidation, and may be a measure of the intrinsic phase resistivity and thickness of the silicide. For example, sheet-resistance 202 vs anneal temperatures 204 is shown in FIG. 2a for a nickel film deposited on a rare earth metal, wherein the rare earth metal comprises about 25 percent of the stacked silicide structure.

As can be seen, stacking a transition metal layer on a rare earth layer and annealing may result in a much lower sheet resistance than the sheet resistance 203 of a pure transition metal silicide alone. In an embodiment, the starting transition metal film thickness may be about the same for the stacked silicide structure and the non-stacked silicide structure, thus the silicide thickness obtained may be expected to be in the same range. Thus, using a stacked silicide comprising a thin rare earth metal layer and a transition metal formed on top will only marginally increase the phase resistivity of the stacked silicide contact structure.

Figure 2B:
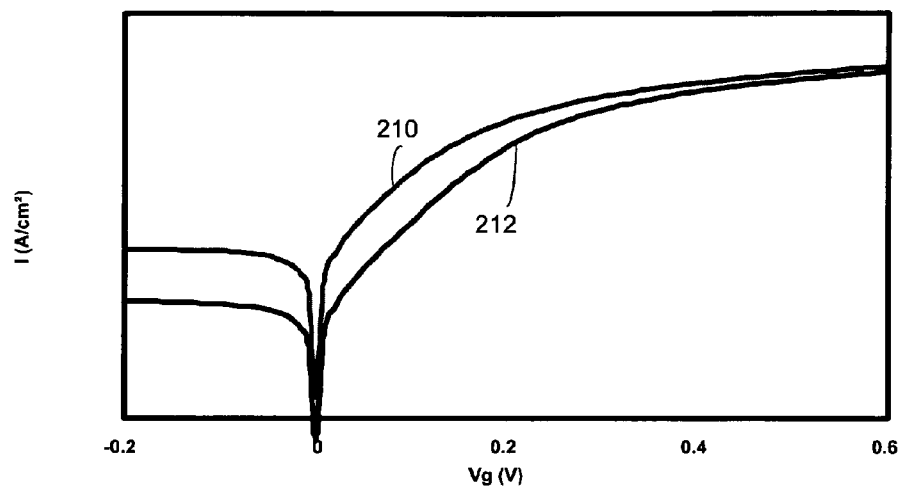

In another embodiment, current-voltage (I-V) measurements of diodes made from a stacked silicide structure 210 comprising a rare earth metal layer with a transition metal layer formed on top taken prior to silicidation is shown in FIG. 2b. As can be seen, diodes made from the stacked structure silicide have a lower forward bias turn-on voltage as compared to control transition metal only diodes 212 (also prior to silicidation). Since contact resistance is an exponential function of the Schottky barrier height, this roughly 100 meV decrease in barrier height represents a major decrease in contact resistance.

The embodiments of the present invention enable transistor scaling and performance according to the roadmap of future technologies. Another benefit of using this approach is that most of the traditional difficulties of integrating rare earth metal only contacts, such as incomplete silicidation, surface pitting, and roughness of the rare earth metal silicide silicon interface, can be avoided while at the same time reducing contact resistance. An advantage of the embodiments of the invention is that a very low interface resistance contact is possible, even at highly scaled pitch (very small source/drain openings). The use of rare earth metal and transition metal contact stack as the contact metal in NMOS devices, reduce contact resistance by lowering Schottky barrier height. Embodiments of the present invention will greatly enhance the practical feasibility of transistor scaling while improving transistor performance.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic structures are well known in the art. Therefore, it is appreciated that the Figures provided herein illustrate only portions of exemplary microelectronic structures that pertain to the practice of the present invention. Thus the present invention is not limited to the structures described herein.

What is claimed is:
1. A structure, comprising:
   a source/drain region of an NMOS transistor, wherein the source/drain region includes a doped silicon portion;
   a tapered recess in an insulating material above the source/drain region, wherein a width of a top portion of the recess is greater than a width of a bottom portion of the tapered recess, and wherein the source/drain region is at a bottom of the tapered recess;
   a stacked metal silicide on the source/drain region, wherein the stacked metal silicide is at least partially in the bottom portion of the tapered recess; and
   a contact metal on the stacked metal silicide;
   wherein the stacked metal silicide comprises a transition metal and a rare earth metal, and at least some of the rare earth metal directly contacts the doped silicon portion of the source/drain region.

2. The structure of claim 1, wherein the rare earth metal comprises at least one of yttrium, lanthanum, cerium, praseodymium, neodymium, promethium, samarium, europium, gadolinium, terbium, dysprosium, holmium, erbium, thulium, and ytterbium.

3. The structure of claim 1, wherein the transition metal comprises at least one of nickel, titanium and cobalt.

4. The structure of claim 1, wherein the contact metal is in the tapered recess.

5. The structure of claim 1, wherein a portion of the rare earth metal layer is segregated towards a silicon/silicide interface of the source/drain region.

6. The structure of claim 1, wherein the rare earth metal occupies less than 25 percent of a thickness of the stacked metal silicide.

7. The structure of claim 1, wherein the rare earth metal has a thickness less than 300 angstroms.

8. The structure of claim 1, wherein the transition metal has a thickness less than 200 angstroms.

9. The structure of claim 1, wherein the stacked metal silicide does not include oxygen.

10. The structure of claim 1, wherein the rare earth metal occupies greater than 66% of a thickness of the stacked metal silicide.

11. The structure of claim 1, wherein the stacked metal silicide includes a region in which the transition metal and the rare earth metal are mixed.

12. The structure of claim 1, wherein the contact metal includes tungsten or titanium.

13. The structure of claim 1, wherein the transition metal and the rare earth metal are formed by co-sputtering.

14. The structure of claim 1, wherein the transition metal and the rare earth metal are interwoven by atomic layer deposition.

15. The structure of claim 1, further comprising:
   a layer of transition metal on the stacked metal silicide.

16. The structure of claim 1, wherein a thickness of the stacked metal silicide is less than 400 angstroms.

17. The structure of claim 1, wherein the stacked metal silicide extends below the bottom of the recess.

18. The structure of claim 1, wherein the insulating material includes an interlayer dielectric.

19. A method of forming a structure in an integrated circuit (IC) device, comprising:
   forming a source/drain region of an NMOS transistor, wherein the source/drain region includes a doped silicon portion;
   forming an insulating material above the source/drain region;
   forming a recess in the insulating material above the source/drain region to expose the source/drain region;
   forming a rare earth metal layer in the recess on the source/drain region; and forming a transition metal layer on the rare earth metal layer in the recess.

20. The method of claim 19, wherein forming the rare earth metal layer and the forming the transition metal layer are performed without breaking vacuum.

21. The method of claim 19, wherein a width of a top portion of the recess is greater than a width of a bottom portion of the recess.

22. The method of claim 19, further comprising:
after forming the transition metal layer, performing an anneal.

23. A structure, comprising:
a source/drain region of an NMOS transistor, wherein the source/drain region includes a doped silicon portion;
a recess in an insulating material above the source/drain region, wherein a width of a top portion of the recess is greater than or equal to a width of a bottom portion of the recess, and wherein the source/drain region is at a bottom of the recess;
a stacked metal silicide on the source/drain region, wherein the stacked metal silicide is at least partially in the bottom portion of the recess; and
a contact metal on the stacked metal silicide;
wherein the stacked metal silicide comprises a transition metal and a rare earth metal, and at least some of the rare earth metal is between the transition metal and the doped silicon portion of the source/drain region.

24. The structure of claim 23, wherein the stacked metal silicide does not include a layer of oxidized rare earth metal.

* * * * *